(12) United States Patent
Fan et al.

(10) Patent No.: US 8,836,416 B2
(45) Date of Patent: Sep. 16, 2014

(54) TUNING CIRCUITRY AND METHOD FOR ACTIVE FILTERS

(71) Applicants: Jianxun Fan, Apex, NC (US); Robert C. Glenn, Cary, NC (US)

(72) Inventors: Jianxun Fan, Apex, NC (US); Robert C. Glenn, Cary, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/755,207

(22) Filed: Jan. 31, 2013

(65) Prior Publication Data
US 2014/0210546 A1 Jul. 31, 2014

(51) Int. Cl.
*H03K 5/00* (2006.01)

(52) U.S. Cl.
USPC ............................... 327/554; 327/552

(58) Field of Classification Search
USPC ................... 327/551–559, 336–337
See application file for complete search history.

(56) References Cited

U.S. PATENT DOCUMENTS

| | | | | |
|---|---|---|---|---|
| 6,111,467 A * | 8/2000 | Luo | | 330/305 |
| 7,050,762 B2 * | 5/2006 | Boldt et al. | | 455/73 |
| 7,057,451 B2 * | 6/2006 | Lou et al. | | 327/553 |
| 7,208,955 B2 * | 4/2007 | Zansky et al. | | 324/418 |
| 7,619,465 B2 * | 11/2009 | Kondo et al. | | 327/553 |
| 7,688,059 B2 * | 3/2010 | Fujiyama et al. | | 324/76.68 |
| 2012/0194265 A1 * | 8/2012 | Katsube et al. | | 327/554 |

OTHER PUBLICATIONS

Analog Devices, Inc., "Ultralow Distortion, Wide Bandwidth Voltage Feedback Op Amps", AD9631/AD9632 Datasheet, Rev. B, Jan. 2003, pp. 1-19.
International Search Report and Written Opinion of the International Searching Authority in PCT/US2014/011841, report dated Jul. 8, 2014.

* cited by examiner

*Primary Examiner* — Dinh Le
(74) *Attorney, Agent, or Firm* — Kenyon & Kenyon LLP

(57) ABSTRACT

Embodiments of the present invention may include a filter with programmable components, a tuning signal generator, a comparator, and a feedback system. The tuning signal generator may input first and second test signals into the filter and the comparator may sample the output of the filter in response to each respective signal. The comparator may then compare the sampled outputs to predetermined values. In response to the comparator's output, the feedback system may vary the programmable components of the filter until the search of the programmable components is exhausted, yielding first and second tuning results. Finally, the feedback system may determine a final tuning result based on the first and second tuning results. Consequently, the filter's actual corner frequency may be within an acceptable range of a desired corner frequency.

33 Claims, 7 Drawing Sheets

(a) Active RC Filter with Voltage Input
100

(b) Trans-Impedance Amplifier (TIA)
110

(c) Transconductance-Capacitance (Gm-C) Filter
120

TUNING CIRCUITRY AND METHOD FOR ACTIVE FILTERS

BACKGROUND

The present invention relates to tuning filters.

Filters are used extensively in the field of electronics and are routinely constructed on integrated circuits (ICs). They are typically constructed using combinations of resistors, capacitors, and amplifiers (RC filters or Gm-C filter) and are designed to remove unwanted components (such as noise) from signals by passing one band (the pass band) of frequency and rejecting another (the stop band). For example, filters may be low pass filters (LPFs), which pass input signals with low frequencies, or high pass filters (HPFs), which pass input signals with high frequencies. The corner frequency of a filter ($f_c$) represents the frequency boundary at which the filter will pass/block components of an input signal. Moreover, the transfer function of a filter, which is a function of its corner frequency, determines an output of the filter in response to a given input.

FIG. 1(a) is an example of an active RC filter 100 with an input voltage Vin an output voltage Vout. The filter 100 includes input resistors $R_{101}$, an amplifier 102, feedback resistors $R_{103}$, and feedback capacitors $C_{104}$. Resistors $R_{101}$, $R_{103}$ and capacitors $C_{104}$ are programmable components, therefore their values can be increased or decreased based on requirements of a system implementing the filter 100. The transfer function of the filter 100 is given by the following equation:

$$\frac{V\text{out}}{V\text{in}} = \frac{R_{103}}{R_{101}} \frac{1}{1+j\frac{f}{f_c}} \quad \text{Eq.(1)}$$

where $$\frac{R_{103}}{R_{101}}$$

is the DC gain of the filter, $$f_c = \frac{1}{2\pi R_{103} C_{104}}$$

is the corner frequency of the filter, and $R_{103}C_{104}$ is the time constant, $\tau$, of the filter 100.

FIG. 1(b) is an example of an active RC filter 110 with a current input (called a "trans-impedance amplifier" or a TIA). The filter includes an amplifier 112, programmable feedback resistors $R_{111}$, and programmable feedback capacitors $C_{113}$. The transfer function of the filter is given by the following equation:

$$\frac{V\text{out}}{I\text{in}} = -R_{111} \frac{1}{1+j\frac{f}{f_c}} \quad \text{Eq.(2)}$$

where $$f_c = \frac{1}{2\pi R_{111} C_{113}}$$

is the corner frequency of the filter 110.

FIG. 1(c) is an example of transconductance-capacitance filter 120 (called a "Gm-C" filter). The filter 120 includes an amplifier 122 with programmable transconductance (Gm) and a programmable capacitor $C_{123}$. The transfer function of the filter 120 is given by the following equation:

$$\frac{V\text{out}}{V\text{in}} = \frac{1}{1+j\frac{f}{f_c}} \quad \text{Eq. (3)}$$

where $$f_c = \frac{Gm}{2\pi C_{123}}$$

is the corner frequency of the filter 120.

Under ideal circumstances, the filters 100, 110, and 120 in FIGS. 1(a)-(c), respectively, would operate at their designed corner frequencies $f_c$. In reality, however, variations in manufacturing processes and operating conditions of ICs, such as voltage and temperature, result in deviations in the actual value of filter components when compared to their design values. For example, in active RC filters resistors and capacitors could vary as large as ±15% across wafers. Amplifier transfer functions also vary significantly over process, voltage, and temperature. These variances significantly impact the transfer function (and corner frequency) of a filter. Therefore, in order to obtain a required transfer function for an on-chip RC filter, the filter must be tuned. A filter can be tuned by varying its components (resistors and capacitors, for example) until a desired output is realized. For example, in FIGS. 1(a) and (b) above, $f_c$ can be coarsely turned by varying the resistor values and finely tuned by varying the capacitor values. In FIG. 1(c), $f_c$ can be tuned by varying either the transconductance of the amplifier Gm or the capacitor value.

Conventional filter tuning methods focus on tuning replica components and/or filter circuits on the IC and using the tuning results to modify the components on the actual filter that needs to be tuned. One conventional method includes creating a replica filter circuit on the IC, tuning the replica circuit to a desired corner frequency, and applying the tuning results to the actual filter in need of tuning. Tuning replica filter circuits, however, has several disadvantages. Most importantly, because of inconsistencies between the replica filters and the actual filters, using tuning results derived from replica circuits to tune actual filters may result in tuning inaccuracies. Additionally, these tuning circuits take up additional space on the ICs, which is undesirable.

Another conventional tuning method includes placing replica components (such as the resistors or capacitors of an RC filter) on the IC, applying current to the replica components, and varying the components until a desired output is realized. However, this method has the same disadvantages of the previously mention tuning method due to replica component variations. Additionally, this method fails to account for amplifier transfer function variances, which also significantly impact the corner frequency of a given filter.

Moreover, neither of the conventional methods account for filter response delays caused by the finite bandwidth of filter components. Filter response delays significantly impact tuning accuracy, especially in high bandwidth applications.

Thus, the inventors recognized a need in the art for an improved filter tuning circuit and method that improves tuning accuracy while reducing the cost of the system.

DETAILED DESCRIPTION

Embodiments of the present invention may include a filter with programmable components, a tuning signal generator, a comparator, and a feedback system. The tuning signal generator may input first and second test signals into the filter and the comparator may sample the output of the filter in response to each respective test signal. The comparator may then compare the sampled outputs to predetermined values. In response to the comparator's output, the feedback system may vary the programmable components of the filter until the search of the programmable components is exhausted, which means that the sampled output in response to the first and second test signals are within a threshold range of the predetermined values, yielding first and second tuning results. Finally, the feedback system may determine a final tuning result for the filter based on the first and second impedance results. Consequently, the filter's actual corner frequency may be within an acceptable range of a desired corner frequency.

Figure 2:
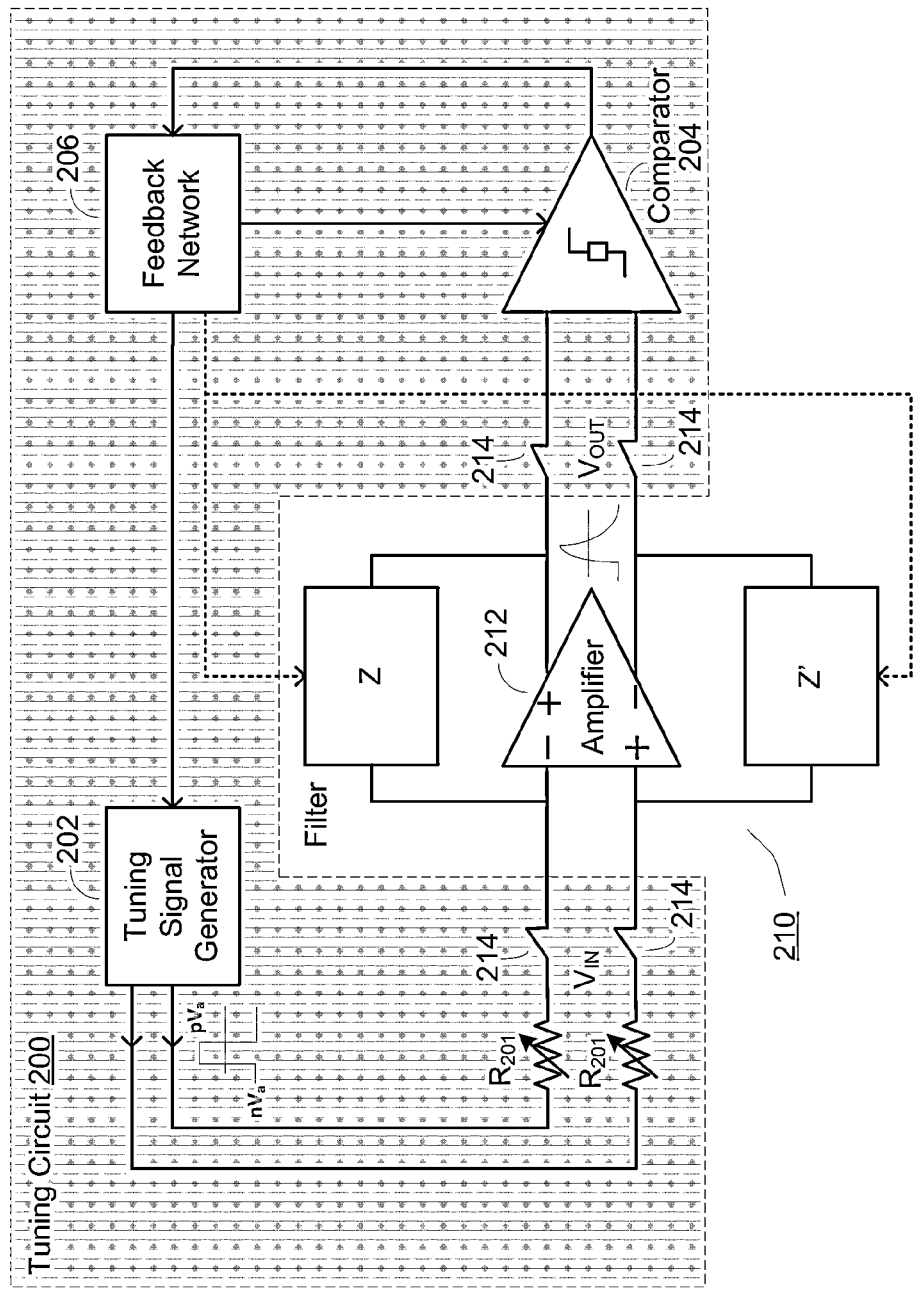
FIG. 2 is a block diagram of a tuning circuit and filter according to an embodiment of the present invention.

FIG. 2 is a block diagram of a tuning circuit 200 and filter 210 according to an embodiment of the present invention. In one embodiment, the tuning circuit 200 and filter 210 may be fabricated on a common integrated circuit die, but, in other embodiments, they may be fabricated on different dies. Moreover, the filter 210 may be selectively disconnected from its normal operation and connected to the tuning circuit 200 with switches 214, at its input and output, when the filter 210 needs to be tuned.

The filter 210 may include an amplifier 212 and variable/programmable impedances Z and Z'. Impedance Z may be coupled to an inverting input and a non-inverting output of the amplifier 212 and impedance Z' may be coupled to a non-inverting input and an inverting output of the amplifier 212. The impedances Z and Z' may comprise any combination of components such as resistors, capacitors, and inductors. Configuration of the impedances Z, Z' may determine characteristics of the filter 210 (e.g., its pass band frequencies).

The filter may be a high pass filter, band pass filter, low pass filter, or any other type of filter. Additionally, according to one embodiment, the filter 210 may be similar to the filters 100, 110, and 120 in FIGS. 1(a), (b), and (c) respectively. However, according to another embodiment, filter 210 may be a single-ended filter.

The tuning circuit 200 may contain input resistors R201, a tuning signal generator 202, a comparator 204, and a feedback network 206. The resistors $R_{201}$ may be coupled to the inputs of the amplifier 212 on one end and the tuning signal generator 202 on the other end. The comparator's 204 inputs may be coupled to the outputs of the amplifier 212 and its output may be coupled to the feedback network 206. The feedback network 206 may further be coupled to the impedances Z, Z' and the tuning signal generator 202.

The tuning signal generator 202 may be configured to generate a desired waveform to be input into the filter 210 during a tuning process. The comparator 204 may compare voltages or currents and output a value based on the comparison. The feedback network 206 may generate a reference clock, control the comparator 204 to sample the filter's 210 output based on the reference clock, reset the comparator 204, and analyze the comparator's 204 output to vary the impedance Z, Z' of the filter 210 as required by the tuning process. The reference clock may generate the tuning signal train, a comparator sample clock that governs the sampling period of the comparator 204, and a comparator reset clock.

During a tuning operation (described in more detail below with reference to FIGS. 3-6), the tuning circuit 200 of FIG. 2 may perform a tuning process on the filter 210. The tuning signal generator 202 may input a test signal into the filter 210 and the comparator 204 may sample the output of the filter 210 in response to the test signal at a predetermined period of time. The comparator 204 may compare the sampled filter 210 output to a predetermined value and output a value based on the comparison result. Based on the value output by the comparator 204, the feedback network 206 may iteratively vary the impedance Z, Z' of the filter 210 until the actual corner frequency of the filter 210 is within an acceptable threshold range of a desired corner frequency. This tuning process may be performed twice to yield two impedance results and the feedback network 206 may derive a final impedance of the filter 210 based on the results.

A tuning operation performed by a tuning circuit on a filter in accordance with an embodiment of the present invention will be discussed in further detail below with reference to FIGS. 3-6. For explanation purposes, FIGS. 3-6 relate to tuning an active RC filter 310 of FIG. 3 with the tuning circuit 300 of FIG. 3 (essentially, substituting the generic filter in FIG. 2 with the RC filter of FIG. 1(a)). Moreover, according to this embodiment, feedback capacitors $C_{305}$ may be varied by the tuning circuit 300 to achieve a desired corner frequency.

As noted above, FIG. 3 is a simplified block diagram of the tuning system of FIG. 2, wherein the generic variable impedance filter 210 is substituted with an RC filter 310. The connections between the tuning circuit 300 and RC filter 310 in FIG. 3 may be substantially similar to the arrangement of the tuning circuit 200 and the generic filter 210 described in FIG. 2 above. The tuning process performed by the tuning circuit 300 on the RC filter 310 of FIG. 3 will be described in further detail with reference to FIGS. 4-6 below.

Embodiments of the present invention are not limited to the arrangement descried above, however. Filter 310 of FIG. 3 may be substituted with other variable impedance filters and the tuning of such a filter may be achieved by varying the impedance of the filter (i.e. resistors, capacitors, inductors, or any combination thereof). In addition, filter 310 may also be substituted with a Gm-C filter which has a variable transconductance.

Figure 3:
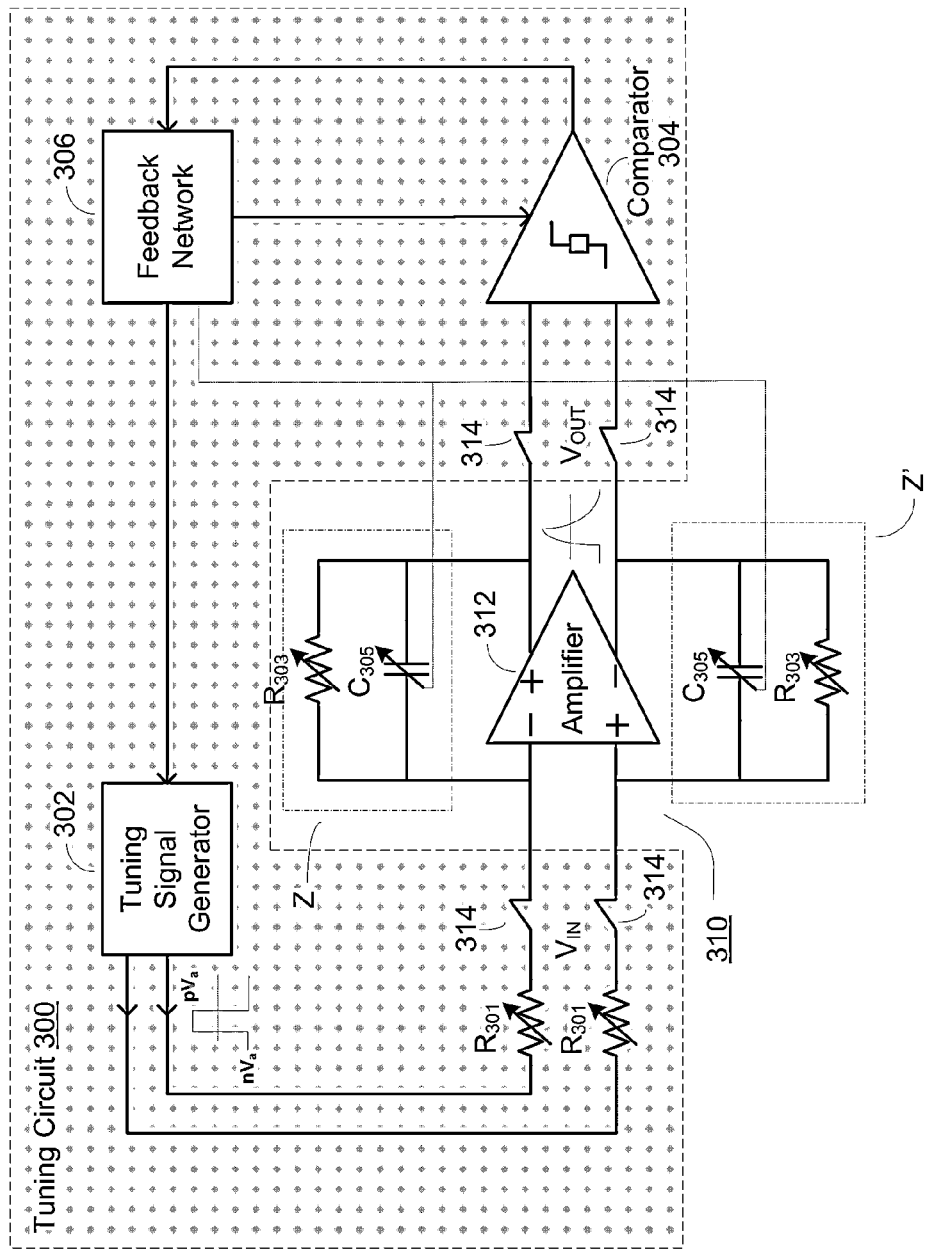
FIG. 3 is a block diagram of a tuning circuit and filter according to an embodiment of the present invention.
Figure 4:
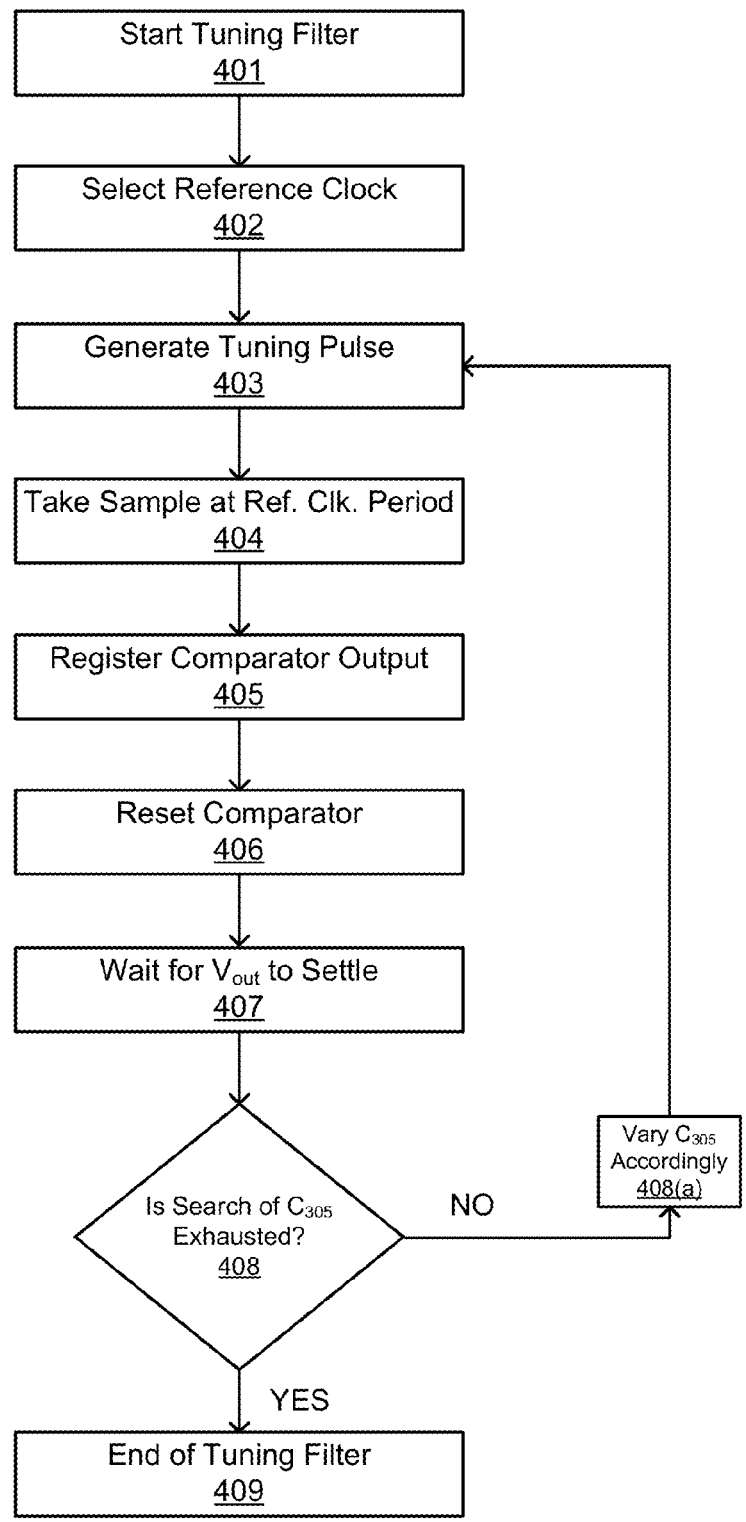
FIG. 4 illustrates a filter tuning method according to an embodiment of the present invention.

FIG. 4 is a flowchart of a tuning process that may be performed by the tuning circuit 300 on the RC filter 310 of FIG. 3. At step 401, the feedback network 306 may begin the tuning operation by selecting a reference clock based on a desired corner frequency of the filter 310 (step 402) (the reference clock calculation will be described in further detail below with reference to FIG. 5). Next, the tuning signal generator 302 may generate a test signal to input into an amplifier 312 of the filter 310 (step 403). In step 404, the comparator 304 may periodically sample the output of the filter 310 in response to the test signal and compare the output to a predetermined value. The predetermined value (derived from a desired corner frequency of the filter) may represent what the filter's 310 output should be at a given time ($T_{clock}$, the period of the reference clock, for example) if the filter 310 has an actual corner frequency that is within an acceptable range of the desired corner frequency.

The comparator 304 may output a first state (either a high or low value) if the sampled output is lower than the predetermined value or a second state (either low or high, as long as it is different than the first state) if the sampled output is higher than the predetermined value.

At steps 405-407, the feedback network 306 may register the comparator's 304 output, reset the comparator 304 and wait for Vout to settle for another iteration of the tuning process. The feedback network 306 may analyze the output of the comparator 304 and determine whether to incrementally increase or decrease the value of $C_{305}$ based on whether the search of $C_{305}$ is exhausted at step 408. Upon varying the value of $C_{305}$ (step 408(a)), the network 306 may revert back to step 403 and input the test signal into the RC filter 310 for another iteration of tuning.

When the search of $C_{305}$ is exhausted (step 408), the filter 310 output should be (by design) within a threshold of the predetermined value. The feedback network 306 may end tuning of the filter 310 and register the resulting value of $C_{305}$ (or the resulting impedance) of the tuning process. According to an embodiment of the present invention, the feedback network 306 may conduct a binary search for the desired $C_{305}$ value in response to the comparator's 304 output.

Although the tuning process described above with respect to FIG. 4 is fairly accurate, it fails to account for the delay $t_d$ (caused by the finite bandwidth of the amplifier 312, the resistors $R_{301}$, and the comparator 304 input) in the response of the RC filter 310. The delay may cause the filter 310 to be tuned to a higher corner frequency than desired. In low bandwidth applications, however, $t_d$ has minimal impacts on the tuning accuracy of the process. In such applications, the delay can be compensated for by adding a similar delay to the sample period of the comparator 304, as shown in the following equation:

$$t_{sample} \approx T_{clock} + t_d \qquad \text{Eq. (4)}$$

It may be impossible to perfectly compensate for the delay because both the delay and the compensation vary with process, temperature, and supply voltage. Moreover, in high bandwidth applications where $T_{clock}$ is small, the problem is more severe because even a minimal uncompensated delay may cause significant tuning inaccuracies.

Thus, according to an embodiment of the present invention, the tuning process described above with reference to FIG. 4 may be performed twice during a tuning operation to calculate a final value of $C_{305}^{(F)}$ (or a final impedance result) that accounts for the actual delay $t_d$ of a filter's 310 response. In other words, for a given tuning operation, the tuning circuit 300 may input a first test signal into the RC filter 310 to yield a first value of $C_{305}^{(1)}$ (or a first impedance result) and a second test signal into the RC filter 310 to yield a second value of $C_{305}^{(2)}$ (or a second impedance result). These two test signals may have different characteristics than each other. The feedback network 306 may then register the two values $C_{305}^{(1)}$, $C_{305}^{(2)}$ resulting from the two tuning processes and derive a final value $C_{305}^{(F)}$ (or final impedance result) that accounts for the delay $t_d$. The final value $C_{305}^{(F)}$ may give the filter 310 an actual corner frequency that is within an acceptable range of a desired corner frequency for the filter 310.

In an embodiment, the tuning process described above with respect to FIG. 4 may be performed by varying any combination of components in a filter (e.g. resistors, capacitors, inductors, amplifier transconductance) in a linear, binary, sub-ranging, logarithmic scale, or a combination thereof.

Figure 5:
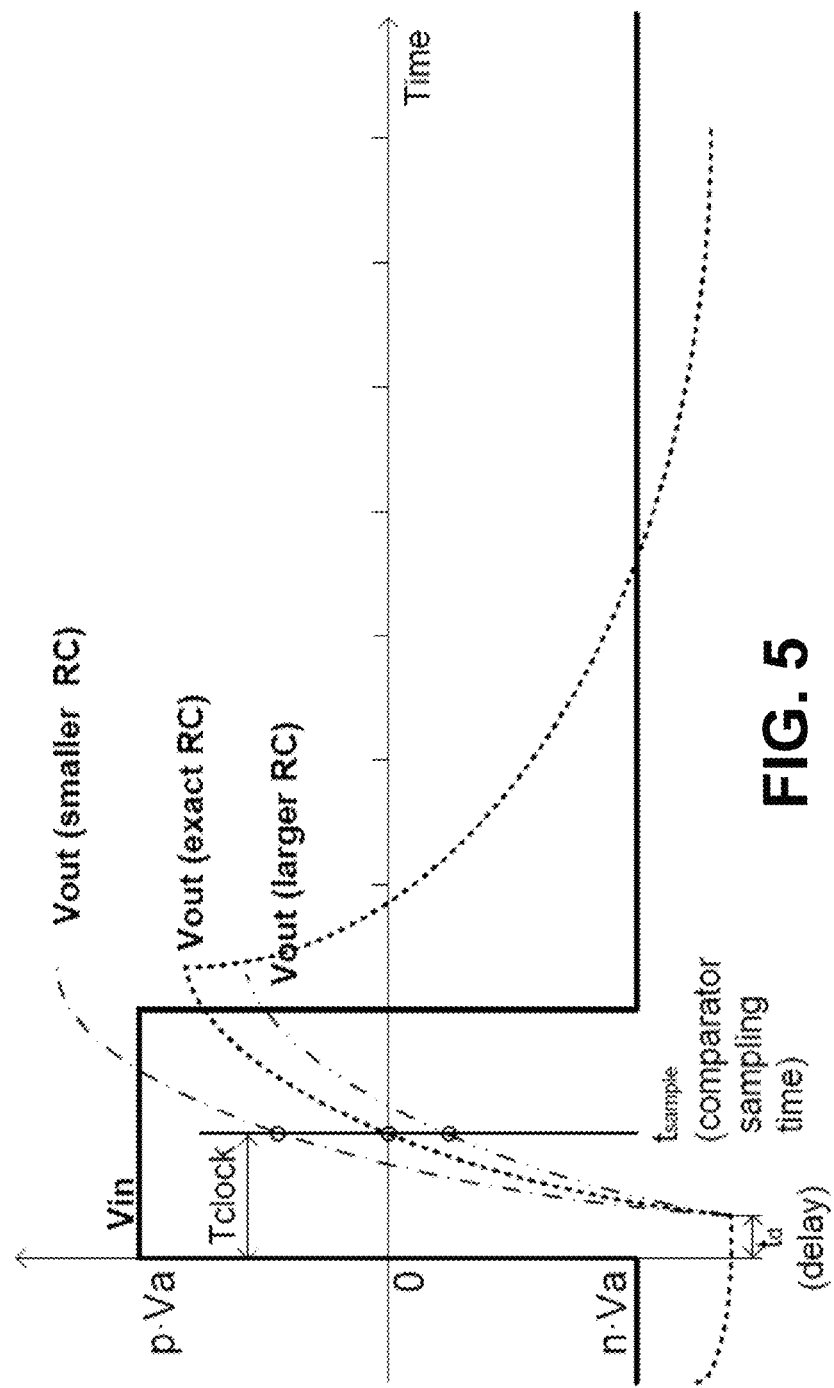
FIG. 5 is a graph of input and output waveforms of a filter tuned according to an embodiment of the present invention.

The derivation of the first and second capacitance values $C_{305}^{(1)}$, $C_{305}^{(2)}$ and a final capacitance value $C_3^{(F)}$ of a tuning operation on the active RC filter 310 of FIG. 3 according to an embodiment of the present invention will now be described with reference to FIG. 5. FIG. 5 is a graph of the input and output voltages for a filter 310 that may be tuned according to an embodiment of the present invention. The X-axis is a function of time, t, and the Y-axis is a function of voltage, V. The input voltage, or a test signal, is depicted as a solid line and may be a step function with a high value of $pV_a$ and a low value of $nV_a$. The output voltages, depicted as dotted lines, may be the filter's 310 responses (step responses) to the test signal (step function) as its impedance varies during the tuning process. Moreover, as discussed above, there may be a delay $t_d$ in the step response of the filter 310 due to its limited bandwidth.

Ignoring the delay $t_d$ and assuming that Vout is fully settled before the rising edge of Vin at time t=0, Vout may be expressed by the following equation:

$$Vout(t) = \frac{R_{303}}{R_{301}} Va\left(p - (p-n)e^{\frac{t}{\tau}}\right), \qquad \text{Eq. (5)}$$

where, the time constant $$\tau = R_{303} \cdot C_{305} = \frac{1}{2\pi f_c}.$$

During the tuning process, $C_{305}$ may be varied to until Vout is within a threshold range of the predetermined value at $t = T_{clock}$, where $T_{clock}$ is the period of the reference clock and the sample time of the comparator 304. Given a desired corner frequency $f_c$ of the RC filter 310, Mock and $F_{clock}$ (the frequency of the reference clock) may be derived as follows:

$$Vout(T_{clock}) = \frac{R_{303}}{R_{301}} Va\left(p - (p-n)e^{\frac{T_{clock}}{\tau}}\right) = 0, \qquad \text{Eq. (6)}$$

$$T_{clock} = \tau \ln\left(\frac{p-n}{p}\right) = R_{303} C_{305} \ln\left(\frac{p-n}{p}\right) = \frac{\ln\left(\frac{p-n}{p}\right)}{2\pi f_c}, \qquad \text{Eq. (7)}$$

$$f_{clock} = \frac{1}{T_{clock}} = \frac{2\pi}{\ln\left(\frac{p-n}{p}\right)} f_c \qquad \text{Eq. (8)}$$

The reference clock $T_{clock}$ may be stored in the feedback network 306, which may control the comparator 304 to sample Vout at $T_{clock}$ to compare the filter's 310 step response to the predetermined value (which is 0 in this case). The comparator 304 may output a high value to the feedback network 306 if the measured Vout at $T_{clock}$ is greater than 0V (indicating that the current RC value may be small), a low value if the measured Vout at $T_{clock}$ is less than 0V (indicating that the current RC value may be high).

Based on the comparator's 304 output, the feedback network 306 may incrementally vary the value of $C_{305}$. For example, if the comparator's 304 output is high, the feedback network 306 may increase the value of $C_{305}$. If the comparator's 304 output is low, the feedback network 306 may decrease the value of $C_{305}$. If $C_{305}$ is modified (either increased or decreased), the tuning process described above may be repeated to compare the filter's 310 output voltage at $T_{clock}$ to the predetermined value (0V in this example) for the modified $C_{305}$ value. This iterative process may continue until $C_{305}$ values have been exhaustively searched, indicating that the current $C_{305}$ value (or the resulting impedance) of the filter 310 gives it an actual corner frequency that is within an acceptable range of a desired corner frequency. In other words, the scaled time constant $$\left(R_{303}C_{305}\ln\left(\frac{p-n}{p}\right)\right)$$

may be compared to $T_{clock}$, and when they are equal, $C_{305}$ is at the desired capacitance.

As described above, a tuning operation in accordance with embodiments of the present invention may include performing the tuning process described above twice to account for the delay $t_d$. For each tuning process, the test signals and the reference clocks may be different. For example, in a first tuning process, a first test signal may be a step input from $n_1 V_a$ to $p_1 V_a$ and an associated first reference clock (given a desired corner frequency) may be calculated as follows:

$$T_{clock1} = R_{303}C_{305}\ln\left(\frac{p_1 - n_1}{p_1}\right) = \frac{1}{2\pi fc}\ln\left(\frac{p_1 - n_1}{p_1}\right) \quad \text{Eq. (9)}$$

Similarly, in a second tuning process, a second test signal may be a step input from $n_2 V_a$ to $p_2 V_a$ and an associated second reference clock (given the desired corner frequency) may be calculated as follows:

$$T_{clock2} = R_{303}C_{305}\ln\left(\frac{p_2 - n_2}{p_2}\right) = \frac{\ln\left(\frac{p_2 - n_2}{p_2}\right)}{\ln\left(\frac{p_1 - n_1}{p_1}\right)} T_{clock1} \quad \text{Eq. (10)}$$

The values of $p_1$, $n_1$, $p_2$, and $n_2$ may be determined based on the needs of a system in which the filter may be implemented.

Accounting for delay $t_d$, Equations 9 and 10 would become:

$$T_{clock1} - t_d = R_{303}C_{305}^{(1)}\ln\left(\frac{p_1 - n_1}{p_1}\right) \quad \text{Eq. (11)}$$

$$T_{clock2} - t_d = R_{303}C_{305}^{(2)}\ln\left(\frac{p_2 - n_2}{p_2}\right) \quad \text{Eq. (12)}$$

where, $C_{305}^{(1)}$ may be the first tuning result with error caused by $t_d$ and $C_{305}^{(2)}$ may be the second tuning result also with error caused by $t_d$. The correct final value of $C_{305}^{(F)}$ without error may be derived by subtracting equation 9 from 10 and equation 11 from 12, as shown below:

$$T_{clock1} - T_{clock2} = R_{303}C_{305}^{(F)}\left[\ln\left(\frac{p_1 - n_1}{p_1}\right) - \ln\left(\frac{p_2 - n_2}{p_2}\right)\right] \quad \text{Eq. (13)}$$

$$T_{clock1} - T_{clock2} = R_{303}\left[C_{305}^{(1)}\ln\left(\frac{p_1 - n_1}{p_1}\right) - C_{305}^{(2)}\ln\left(\frac{p_2 - n_2}{p_2}\right)\right] \quad \text{Eq. (14)}$$

$$C_{305}^{(F)} = \frac{C_{305}^{(1)}\ln\left(\frac{p_1 - n_1}{p_1}\right) - C_{305}^{(2)}\ln\left(\frac{p_2 - n_2}{p_2}\right)}{\ln\left(\frac{p_1 - n_1}{p_1}\right) - \ln\left(\frac{p_2 - n_2}{p_2}\right)} \quad \text{Eq. (15)}$$

Thus, by tuning the filter 310 twice with different test signals and reference clocks, a desired $C_{305}^{(F)}$ value for the filter 310 may be achieved using Equations 13-15. Consequently, the tuning error caused by any fixed delay may be canceled. The accuracy of the final tuning result depends on the resolution of $C_{305}$, which may be controlled by a designer and limited by manufacturability.

FIG. 6 includes two graphs of input and output waveforms of the filter 310 of FIG. 3 tuned twice according to an embodiment of the present invention. Although there are unlimited options for the $p_1$, $n_1$, $p_2$, and $n_2$ values, an embodiment of the present invention where $$p_1 = 1, n_1 = -1, p_2 = \frac{1}{2}, \text{ and } n_2 = -\frac{3}{2}$$

may result in simple calculations for $T_{clock1}$, $T_{clock2}$, and $C_{305}^{(F)}$.

Figure 6A:
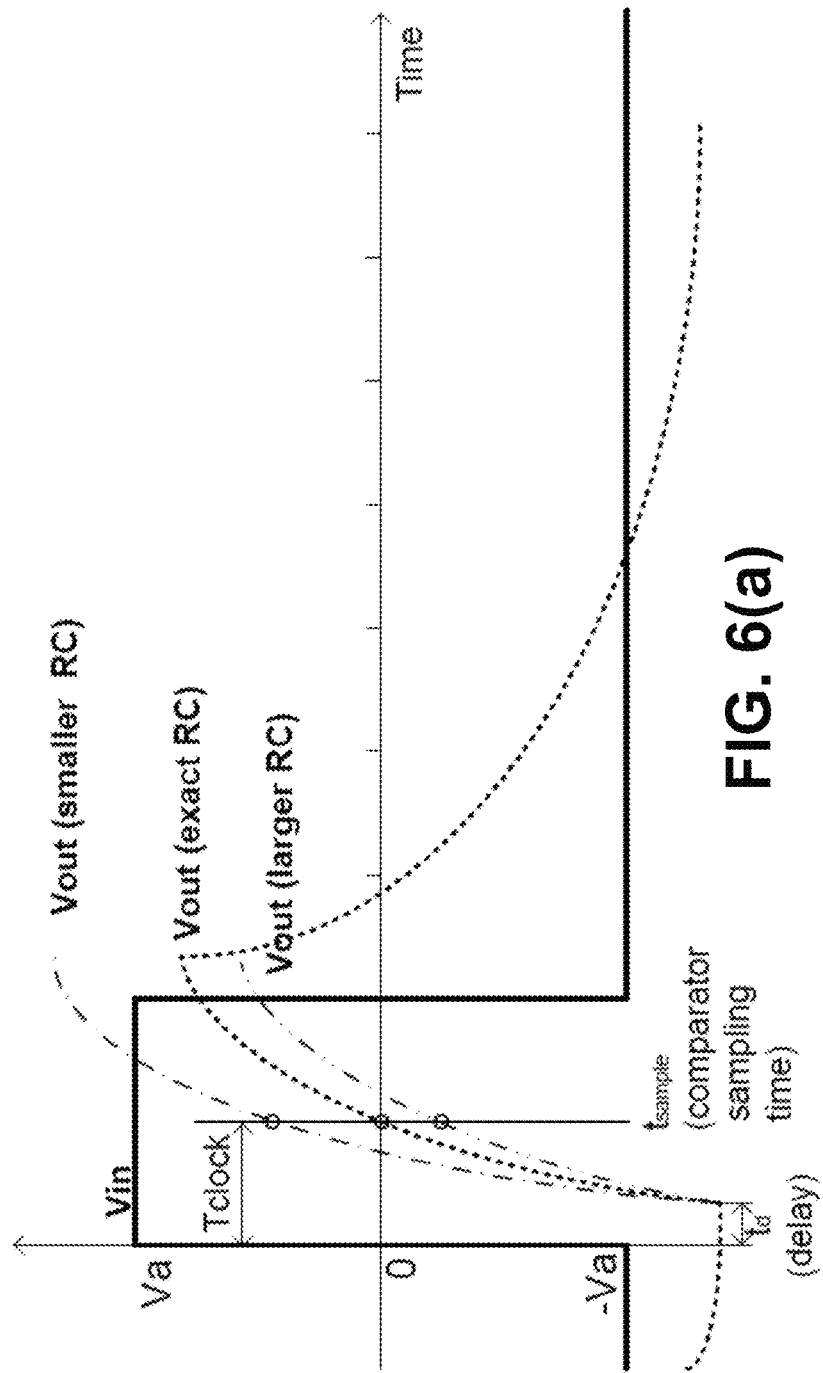
FIG. 6(a) is a graph of first input and output waveforms of a filter tuned according to an embodiment of the present invention.
Figure 6B:
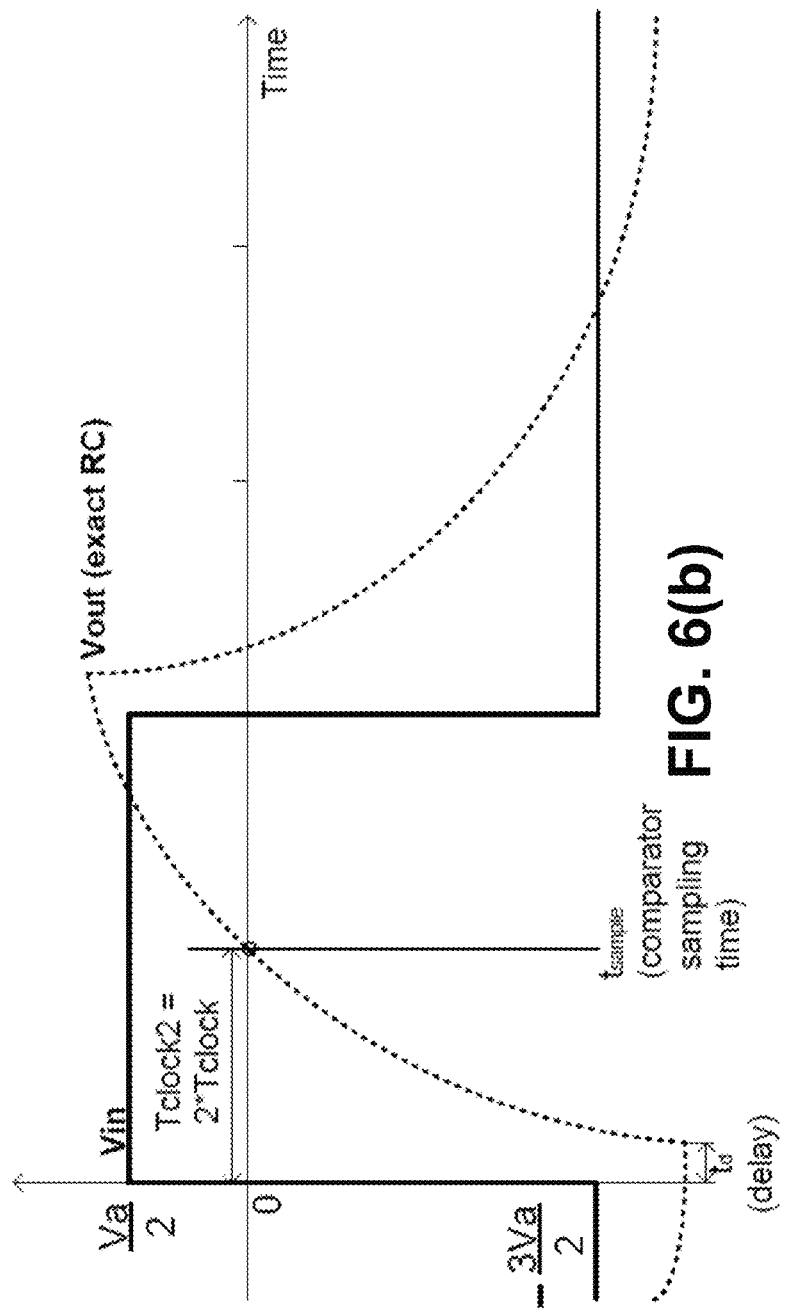
FIG. 6(b) is a graph of second input and output waveforms of a filter tuned according to an embodiment of the present invention.

FIGS. 6(a) and (b) are graphs of these inputs and the resulting RC filter 310 outputs. FIG. 6(a) is a graph of a first test signal that may range from $V_a$ to $-V_a$. The first test signal may have a corresponding reference clock $T_{clock1}$ and comparator 304 sampling time $t_{sample}$. The filter's 310 outputs in response to the first test signal may vary as the impedance of the filter 310 is modified (as shown by the dotted lines). Similarly, FIG. 6(b) is a graph of a second test signal that ranges from $$\frac{V_a}{2} \text{ to } \frac{3V_a}{2}.$$

The second test signal may have a corresponding reference clock $T_{clock2}$ and a comparator 304 sampling time $t_{sample}$. Also, the filter's 310 output in response to the second test signal may vary as the impedance of the filter 310 is modified.

Substituting the above values for $p_1$-$n_2$ in equations 9 and 10 leads to the following expressions for $T_{clock1}$ and $T_{clock2}$.

$$T_{clock1} = R_{303}C_{305}\ln(2) \qquad \text{Eq. (16)}$$

$$T_{clock2} = R_{303}C_{305}\ln(4) = 2T_{clock1} \qquad \text{Eq. (17)}$$

The double relationship between the two reference clocks may be easy to implement because only one reference clock is needed. The second reference clock may be locally generated with a divider (not shown). A tuning operation may be performed twice on the filter 310 using the first and second test signals and corresponding reference clocks. The operation may result in two values of $C_{305}$, each corresponding to the impedance result of tuning performed using the respective test signals. These capacitors values, $C_{305}^{(1)}$ and $C_{305}^{(2)}$, may not account for a time delay $t_d$ of the filter 310 (as described above). Thus, using equations 13-15, a final $C_{305}^{(F)}$ value that accounts for filter 310 response delay $t_d$ may be calculated in the following manner:

$$C_{305}^{(F)} = 2 \cdot C_{305}^{(2)} - C_{305}^{(1)} \qquad \text{Eq. (18)}$$

In another embodiment, the input signals of FIGS. 5 and 6 may be other types of signal. Of course, the output and delay $t_d$ of the filter 310 in response to a given input signal may vary depending on the input signal used. Moreover, as described above, the values of $p_1$-$n_2$ may be modified as required by the system implementing a filter that needs to be tuned.

Figure 1:
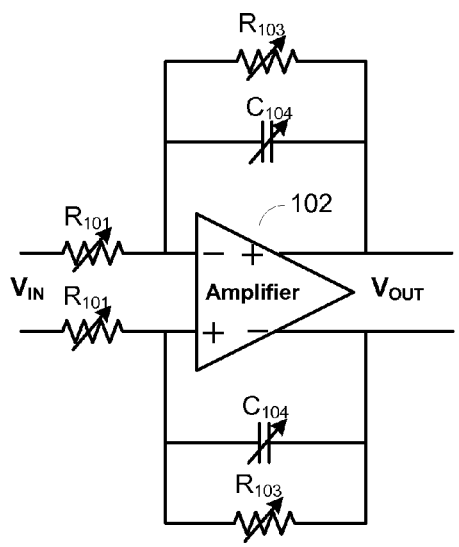
FIG. 1(a) is a circuit diagram of an active RC filter with a voltage input.
FIG. 1(b) is a circuit diagram of a trans-impedance amplifier with a current input.
FIG. 1(c) is a circuit diagram of a transconductance-capacitance filter with a voltage input.
Figure 1:
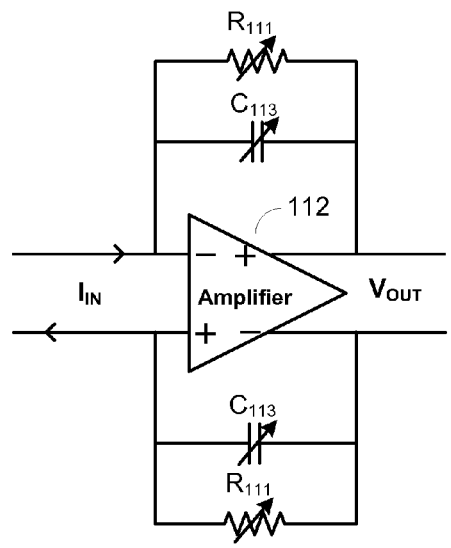
Figure 1:
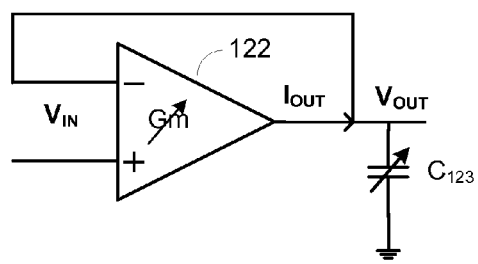

Although some embodiments described above discuss tuning an active RC filter with a voltage input test signal as an example, the same tuning circuitry and methods may be used to tune other filters such as a TIAs (FIG. 1(b)) and a Gm-C (FIG. 1(c)) filters. However, to tune a TIA according to embodiments of the present invention, the input test signal may be changed from a voltage signal to a current signal by modifying the tuning signal generator in FIGS. 2 and 3. To tune a Gm-C filter, the transconductance may be varied. The basic tuning principles herein may apply to other types of filters not specifically discussed in the disclosure.

Although the foregoing techniques have been described above with reference to specific embodiments, the invention is not limited to the above embodiments and the specific configurations shown in the drawings. For example, some components shown may be combined with each other as one embodiment, or a component may be divided into several subcomponents, or any other known or available component may be added. Those skilled in the art will appreciate that these techniques may be implemented in other ways without departing from the sprit and substantive features of the invention. The present embodiments are therefore to be considered in all respects as illustrative and not restrictive.

We claim:

1. A circuit comprising:
   a filter comprising programmable components; and
   a tuning circuit comprising:
      a stimulus generator having an output coupled to an input of the filter, the stimulus generator to generate a pair of signals having different characteristics from each other, wherein the first signal is input into the filter during a first tuning interval and the second signal is input into the filter during a second tuning interval,
      a comparator having an input coupled to an output of the filter, wherein the comparator compares the filter's output to a respective threshold in each interval; and
      a feedback network to:
         generate a reference clock to send to the comparator to sample the output of the filter,
         activate the stimulus generator,
         read an output from the comparator in each interval,
         during each interval, vary the programmable components of the filter according to a search algorithm to derive a respective setting of the programmable components to approximate a desired corner frequency of the filter; and
         calculate a final setting of the programmable components based on the settings derived from the two intervals.

2. The circuit of claim 1, wherein the filter and the tuning circuit are provided in a common integrated circuit.

3. The circuit of claim 1, wherein the filter is an RC filter comprising an amplifier and programmable impedance components.

4. The circuit of claim 1, wherein the filter is a transconductance-capacitance filter comprising an amplifier with programmable transconductance.

5. The circuit of claim 4, wherein the filter comprises a programmable capacitance.

6. The circuit of claim 1, wherein the final setting gives the filter a desired corner frequency.

7. The circuit of claim 1, wherein the signals are voltage pulses.

8. The circuit of claim 1, wherein the signals are current pulses.

9. The circuit of claim 1, wherein the comparator samples the output of the filter in response to each signal until the feedback network derives the respective setting of the programmable components.

10. The circuit of claim 9, wherein, for each tuning interval, the feedback network varies the programmable components of the filter until the search algorithm is complete.

11. The circuit of claim 9, wherein the feedback network varies the programmable components until the sampled output values are within a threshold range of the corresponding predetermined values.

12. The circuit of claim 1, wherein the signals have different amplitudes and periods.

13. A method for tuning a filter with programmable components, comprising:
   iteratively, until a first search of the programmable components is exhausted and a first tuning result is derived:
      inputting a first test signal into the filter,
         inputting a reference clock to a comparator to sample an output of the filter
         comparing the filter's response to the first test signal to a first predetermined value using said comparator; and
         when the filter's response does not match the first predetermined value, varying the programmable components of the filter for another iteration,
   iteratively, until a second search of the programmable components is exhausted and a second tuning result is derived:
      inputting a second test signal, having different characteristics than the first, into the filter,
         comparing the filter's response to the second test signal to a second predetermined value,
         when the filter's response does not match the second predetermined value, varying the programmable components of the filter for another iteration; and
      calculating a final setting of programmable components of the filter based on the first and second tuning results.

14. The method of claim 13, wherein the filter is an RC filter comprising an amplifier and programmable impedance components.

15. The method of claim 13, wherein the filter is a transconductance-capacitance filter comprising an amplifier with programmable transconductance.

16. The method of claim 15, wherein the filter comprises a programmable capacitance.

17. The method of claim 13, wherein the test signals are voltage pulses.

18. The method of claim 13, wherein the test signals are current pulses.

19. The method of claim 13, wherein the comparing further comprises measuring the filter's response to the first test signal at a first predetermined period and the filter's response to the second test signal at a second predetermined period.

20. The method of claim 19, wherein the predetermined periods are determined based on a desired corner frequency of the filter.

21. The method of claim 13, wherein an actual corner frequency of the filter with the final setting is within a predetermined range of a desired corner frequency of the filter.

22. The method of claim 13, wherein the test signals have different amplitudes and periods.

23. The method of claim 13, wherein:
the comparing further comprises outputting a first state if the filter's response to either of the test signals is lower than the corresponding predetermined value or a second state if the response is higher than the corresponding predetermined value; and
the programmable components are varied based on the comparator output until the first and second searches of the programmable components are exhausted.

24. A tuning circuit comprising:
a tuning signal generator to input first and second test signals, having different characteristics from each other, into a filter with programmable components,
a comparator to:
sample the filter's output at a first predetermined period after the first test signal is input into the filter and a second predetermined period after the second test signal is input into the filter, and
compare the sampled outputs to predetermined values; and
a feedback system coupled between said comparator and said tuning signal generator to: generate a reference clock to the comparator for sampling the output of the filler and modify the programmable components of the filter until a search of the programmable components is exhausted, wherein
a first tuning result represents a value of the programmable components at which the sampled output in response to the first test signal is within the threshold range of a first predetermined value,
a second tuning result represents a value of the programmable components at which the sampled output in response to the second test signal is within the threshold range of a second predetermined value; and
the feedback system calculates a final setting representing a final tuned value of the programmable components for the filter based on the first and second tuning results.

25. The circuit of claim 24, wherein the filter is an RC filter comprising an amplifier and programmable impedance components.

26. The circuit of claim 24, wherein the filter is a transconductance-capacitance filter comprising an amplifier with programmable transconductance.

27. The circuit of claim 26, wherein the filter comprises a programmable capacitance.

28. The circuit of claim 24, wherein the test signals are voltage pulses.

29. The circuit of claim 24, wherein the test signals are current pulses.

30. The circuit of claim 24, wherein the predetermined periods are determined based on a desired corner frequency of the filter.

31. The circuit of claim 24, wherein an actual corner frequency of the filter with the final setting is within a predetermined range of a desired corner frequency of the filter and the final setting accounts for errors caused by a delay in the filter's response to the first and second test signals.

32. The circuit of claim 24, wherein the test signals have different amplitudes and periods.

33. The circuit of claim 24, wherein
the comparator outputs a first state if the filter's output in response to either of the test signals is lower than the corresponding predetermined value or second state if the output is higher than the corresponding predetermined value; and
the programmable components are varied based on the comparator output until the search of the programmable components is exhausted.

* * * * *